United States Patent [19]

Takagi et al.

[11] Patent Number: 5,072,282
[45] Date of Patent: Dec. 10, 1991

[54] MULTI-LAYER WIRINGS ON A SEMICONDUCTOR DEVICE AND FABRICATION METHOD

[75] Inventors: Hideo Takagi, Kawasaki; Noriyuki Suzuki, Yokohama, both of Japan

[73] Assignee: Fujitsu Limited, Kawasaki, Japan

[21] Appl. No.: 565,866

[22] Filed: Aug. 10, 1990

Related U.S. Application Data

[63] Continuation of Ser. No. 369,591, Jun. 20, 1989, abandoned.

[30] Foreign Application Priority Data

Jun. 23, 1988 [JP] Japan ................... 63-156225

[51] Int. Cl.$^5$ ............... H01L 23/48; H01L 29/46; H01L 29/54; H01L 29/62
[52] U.S. Cl. ........................... 357/71; 357/67; 357/68; 357/51; 428/209
[58] Field of Search ............... 357/71, 68, 51, 67; 428/209

[56] References Cited

U.S. PATENT DOCUMENTS

| | | | |
|---|---|---|---|
| 4,436,582 | 3/1984 | Saxena | 357/71 |
| 4,533,935 | 8/1985 | Mochizuki | 357/71 S |
| 4,707,723 | 11/1987 | Okamoto et al. | 357/71 |
| 4,708,904 | 11/1987 | Shmizu et al. | 357/71 |

FOREIGN PATENT DOCUMENTS

| | | | |
|---|---|---|---|
| 3123348 | 3/1982 | Fed. Rep. of Germany . | |
| 0058943 | 3/1988 | Japan | 357/71 |
| 2184600 | 12/1985 | United Kingdom . | |

Primary Examiner—Andrew J. James
Assistant Examiner—Stephen D. Meier
Attorney, Agent, or Firm—Armstrong, Nikaido, Marmelstein, Kubovcik & Murray

[57] ABSTRACT

A first layer-wiring formed of a material soluble in a solution containing hydrofluoric acid (HF) is protected in an insulating layer. A second layer-wiring insulatingly overlying the first layer is connected with the first layer-wiring via a third layer-wiring which is resistant to a solution containing HF. When contact holes are opened through the insulating layer so as to lead out the first layer-wiring and/or a part of the semiconductor substrate, the first layer-wiring is not exposed to HF containing solution for cleaning the exposed materials in the opened holes. Accordingly, a material having small electrical conductivity but soluble by the HF can be employed for the layer-wiring allowing a high density integration as well good electrical contact with the Si substrate and with other multi-layer wirings.

7 Claims, 7 Drawing Sheets

MULTI-LAYER WIRINGS ON A SEMICONDUCTOR DEVICE AND FABRICATION METHOD

This application is a continuation of application Ser. No. 369,591 filed June 20, 1989 now aband.

BACKGROUND OF THE INVENTION

1. Field of the Invention

This invention relates to materials and fabrication method for multi-layer wirings on a semiconductor device.

2. Description of the Related Art

In order to enhance integration density of LSI (Large Scale Integrated circuit), its wiring is becoming finer and finer. Accordingly, material of the wiring is required to have high electrical conductivity as well as good electrical contact with other wirings and electrodes. There are suitable materials available to meet this requirement, such as aluminum (referred to hereinafter as Al) or titanium silicide (referred to hereinafter as $TiSi_x$). However, they are soluble by a hydrofluoric acid (referred to hereinafter as HF) solution, which is employed to remove undesirable native oxide of the semiconductor material or the wiring material in order to achieve a good contact with other wiring material. Therefore, there are problems in difficulty of the design as well as complication of the fabrication process of the LSI.

Figure 1:
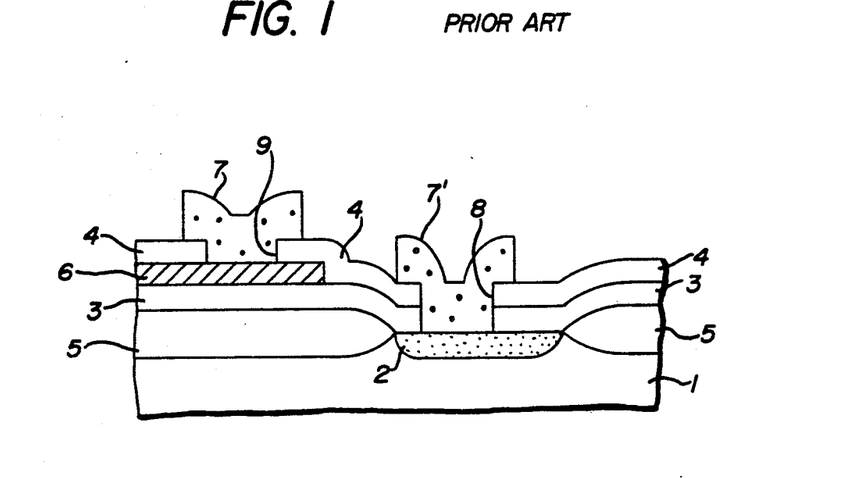
FIG. 1 is for explaining problems of prior art multi-layer wirings.

In reference to FIG. 1, the problems of prior art wirings will now be described in detail. On a semiconductor substrate 1, there is formed a doped region 2 of the semiconductor substrate 1. On insulating layers 3 and 5, each formed of silicon dioxide (referred to hereinafter as $SiO_2$), there is a conductive layer-wiring 6 formed of $TiSi_2$. On the $SiO_2$ layer 3 and the $TiSi_2$ layer 6, there is an insulating layer 4 formed of $SiO_2$. On the $SiO_2$ layer 4 there is another conductive layer-wiring, a top wiring, 7 formed of Al for connecting a doped Si region 2, the $TiSi_2$ layer 6 and others. The $SiO_2$ layer 5 is formed by a selective oxidization for laterally isolating the doped Si region 2. Basic fabrication process of the layer-wirings 6 and 7 is as follows. Contact holes 8 and 9 are opened through $SiO_2$ layers 3 and 4, so that a part of the wiring 6 and a part of the doped Si region 2 are exposed. After undesirable native oxides of the exposed materials 2 and 6 in the contact holes 8 and 9 are chemically removed, Al wiring is patterned over the insulating layer 4 to make electrical connections with the exposed portions of the $TiSi_2$ layer-wiring 6 and the doped Si region 2. In the above process for removing the native oxide, if a HF solution is used the $TiSi_2$ layer 6 is etched. If argon+ spatter etching is employed for removing the native oxide in place of the HF solution, the surface of the doped Si region 2 is damaged by the physical bombardment of the argon ion, resulting in an increase in contact resistance between the Al wiring 7 and the doped Si region 2. Therefore, in order to avoid these problems a buffer layer may be introduced between the Al layer 7 and the doped Si region 2, and/or between the Al layer 7 and the $TiSi_2$ layer 6. Or, if avoiding the introduction of the buffer layer, the contact hole 9 and the Al layer 7 are first fabricated, then the Al layer is coated with an $SiO_2$ layer for protection against HF; secondly the contact hole 7' is opened and cleaned with HF solution for removing its native oxide, and Al layer 7' is deposited over the contact hole 8. Thus, either of these methods causes a difficulty of designing the semiconductor structure, or a considerable increase of the process steps, because the materials exposed in the contact holes are of differing types requiring different solvents suitable for each material. Thus, it is difficult to efficiently achieve a good electrical contact with each different material while completely free from affection of each other process.

SUMMARY OF THE INVENTION

It is a general object of the invention, therefore to provide structures and its fabrication methods of wirings each of which has small electrical resistivity and is suitable for a multi-layer structure, of a semiconductor device.

It is another object of the invention to provide structures and fabrication methods of wirings which allow an employment of hydrofluoric acid (HF) solution in the fabrication process.

A first layer-wiring formed of a material soluble by a solution containing hydrofluoric acid (HF) is protected in an insulating layer. A second layer-wiring insulatingly overlying the first layer is connected with the first layer-wiring via a third layer-wiring which is resistant to a solution containing HF. When contact holes are opened through the insulating layer so as to lead out the first layer-wiring and/or a part of the semiconductor substrate, the first layer-wiring is not exposed to HF containing solution for cleaning the exposed materials in the opened holes. Accordingly, a material having small electrical conductivity but soluble by the HF can be employed for the layer-wiring allowing a high density integration as well good electrical contact with the Si substrate and with other multi-layer wirings.

The above-mentioned features and advantages of the present invention, together with other objects and advantages, which will become apparent, will be more fully described hereinafter, with reference being made to the accompanying drawings which form a part hereof, wherein like numerals refer to like parts throughout.

BRIEF DESCRIPTION OF THE DRAWINGS

FIGS. 4(1)–4(8) are steps of fabrication process of the layer wirings of FIG. 3 according to the present invention.

FIGS. 9(1)-9(6) are steps of fabrication process of the layer wirings of FIG. 2(b) according to the present invention.

DESCRIPTION OF THE PREFERRED EMBODIMENTS

Figure 2A:
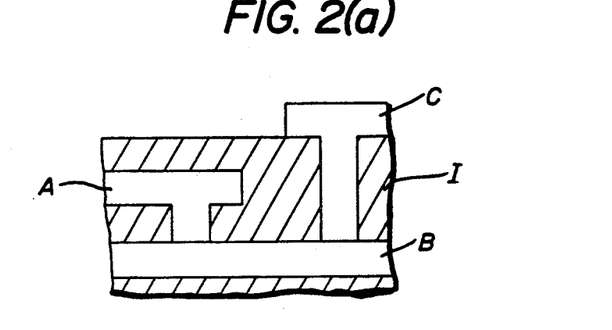
FIGS. 2(a) and 2(b) are principle structures of layer wirings according to the present invention.

Referring to FIG. 2(a), a first principle structure of layer-wiring according to the present invention is hereinafter described. In FIG. 2(a), a layer A is formed of a material, which is soluble by a solution containing hydrofluoric acid (HF), such as titan silicide ($TiSi_x$). A layer B, buried in a silicon dioxide ($SiO_2$) layer I, is formed of a material which is resistant against the HF solution, such as tungsten silicide ($WSi_x$). A layer C is a top wiring formed of aluminum (Al) containing approximately 1% Si.

Figure 3:
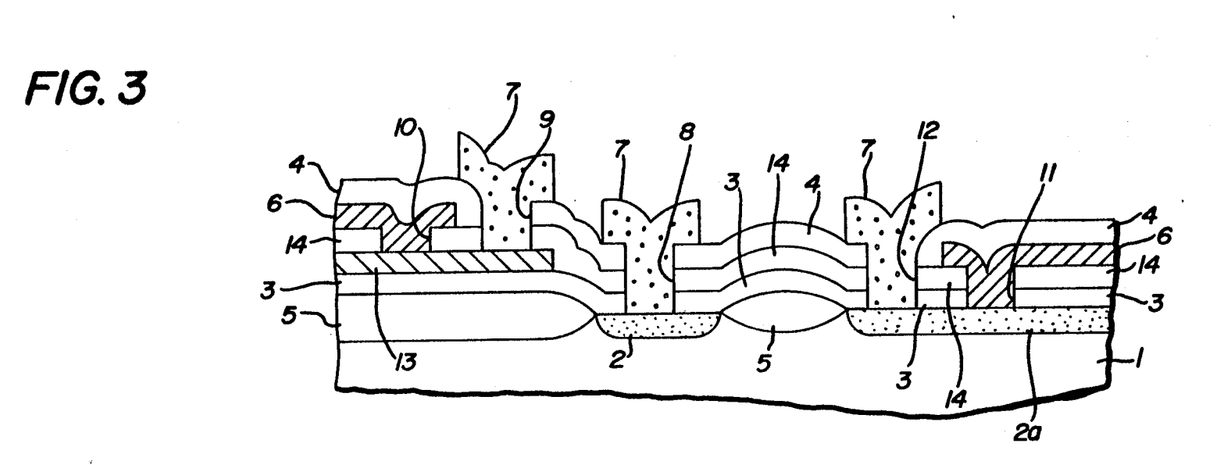
FIG. 3 is a cross-sectional view of a structure of a preferred embodiment of the present invention shown in FIG. 2(a).
Figure 4:
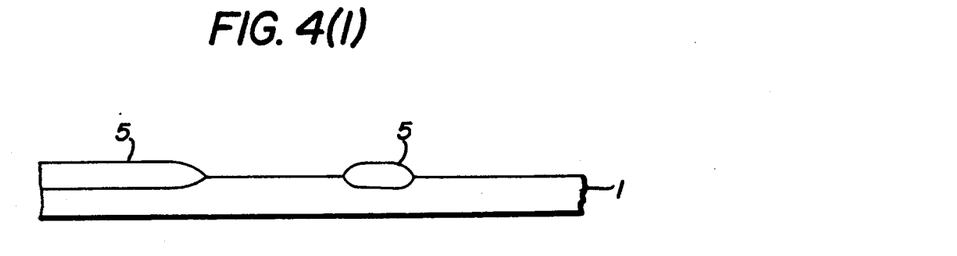

A practical embodiment of the structure of FIG. 2(a) is shown in FIG. 3. In FIG. 3, the numeral 1 denotes a semiconductor substrate formed of, such as silicon; the numeral 2 and 2a denote regions doped with an impurity in a silicon (Si) substrate 1; the numerals 3, 4 and 14 denote insulating layers formed of $SiO_2$ which was referred to as I in FIG. 2(a); the numeral 5 denotes a field insulating layer formed of $SiO_2$ for laterally isolating the doped Si region 2 and 2a, etc.; the numeral 6 denotes a layer-wiring formed of a soluble material by HF solution, such as $TiSi_x$ which was referred to as material A in FIG. 2(a); the numeral 7 denotes a top layer-wiring formed of widely employed Al which contains typically 1% silicon, referred to as material C in FIG. 2(a); the numerals 8, 9, 10, 11 and 12 denote contact holes; and the numeral 13 denotes a layer wiring formed of a material which is not soluble by HF solution, such as $WSi_x$, which was referred to as material B in FIG. 2(a). The amount x of the $TiSi_x$ is 1.8 to 3.0, typically 2. The amount x of the $WSi_x$ is 1.8 to 3.0, typically 2. The 1% Si content in the Al is for achieving good contact with the doped Si region, as well known.

Typical steps of the fabrication process of the layer structure shown in FIG. 3 are hereinafter described, in reference to FIGS. 4(1) through 4(8), where same numerals are used to denote same parts of the structure of FIG. 3.

In step 1, shown in FIG. 4(1), $SiO_2$ regions 5 are formed on the silicon substrate 1 according to generally known LOCOS (local oxidization of silicon) method as thick as, for example, 6000 Å.

In step 2, shown in FIG. 4(2), an impurity, such as As (arsenic) ion, is implanted into the silicon substrate as much as, for example, $4 \times 10^{15}$ cm$^{-2}$, and then the substrate is heated at typically 950° C. for 20 minutes for its activation; thus, there are formed doped Si regions 2 and 2a.

In step 3, shown in FIG. 4(3), an approximately 2000 Å thick $SiO_2$ film 3 is deposited thereover typically by a widely known CVD (chemical vapor deposition) method.

In step 4, shown in FIG. 4(4), a typically 2000 Å thick polycrystalline silicon film 13-1 and typically 2000 Å thick $WSi_x$ film 13-2 thereon are deposited upon the substrate of the step 3 according to a widely known method, such as CVD, respectively. Thus laminated two layers form a tungsten polycide layer 13. Next, the deposited layers 13-1 and 13-2 are patterned respectively according to widely employed photo-lithography technique.

In step 5, shown in FIG. 4(5), an approximately 2000 Å thick $SiO_2$ film 14 is deposited thereover typically by a CVD method. Next, contact holes 10 and 11 are opened through the $SiO_2$ films 3 and 14 so as to expose a part of the $WSi_x$ layer wiring 13 and a part of the doped Si region 2 respectively, by a widely known dry etching method employing an etchant gas, such as tetrafluoride methane ($CF_4$). Next, the exposed parts in the contact holes 10 and 11 are cleaned with a HF containing solution (typically 5% HF solved in pure water) so as to remove undesirable native oxides of the exposed parts.

In step 6, shown in FIG. 4(6), a typically 2000 Å thick $TiSi_x$ film is deposited thereover typically by a sputtering method, and is patterned so as to form the layer wiring 6 according to widely employed photo-lithography technique.

In step 7, shown in FIG. 4(7), a typically 2000 Å thick $SiO_2$ film 4 is deposited thereover. Next, contact holes 8, 9 and 12 are opened through the $SiO_2$ layers 4, 14 and 3 so as to expose a part of the $WSi_x$ wiring 13 and a part of the doped Si regions 2 and 2a, respectively. The exposed portion in the contact holes 8, 9 and 12 are cleaned with a HF containing solution essentially same to that of step 5 so as to remove undesirable native oxides of the exposed materials.

In step 8, shown in FIG. 4(8), a typically 0.5 μm thick film of Al which contains typically 1% Si is deposited thereover according to a widely known method, such as sputtering, and then, is patterned by generally known photo-lithography technique so as to form a top layer wiring 7 having electrically good contacts with $WSi_x$ wiring 13 and the doped Si regions 2 and 2a, respectively.

According to the above-described process, when the contact holes 10 and 11 are opened by a dry etching method employing $CF_4$ gas in step 5, the doped Si region 2a or $WSi_x$ layer 13 is not damaged by a physical bombardment of the $CF_4$ because the $CF_4$ reacts chemically. Furthermore, little of the doped Si region 2a and $WSi_x$ layer 13 is contaminated with their native oxides. When the contact holes 8, 9 and 12 are opened in step 7, neither of the doped Si region 2 or $TiSi_x$ layer 6 is damaged by the $CF_4$ because of the same reason as that of step 5. Furthermore, when the native oxides of the $TiSi_2$ and the doped Si is removed by the HF containing solution, neither of the $WSi_x$ layer 13 or the doped Si region 2 is damaged by the HF solution. Then, the $TiSi_x$ layer 6, which is soluble by the HF solution is protected with $SiO_2$ layer 4 from the HF solution. Thus, both the doped Si and the $WSi_x$ layer can be clean without damage or contamination, resulting in electrically good contacts with the the Al layers 7 deposited thereon.

Figure 5:
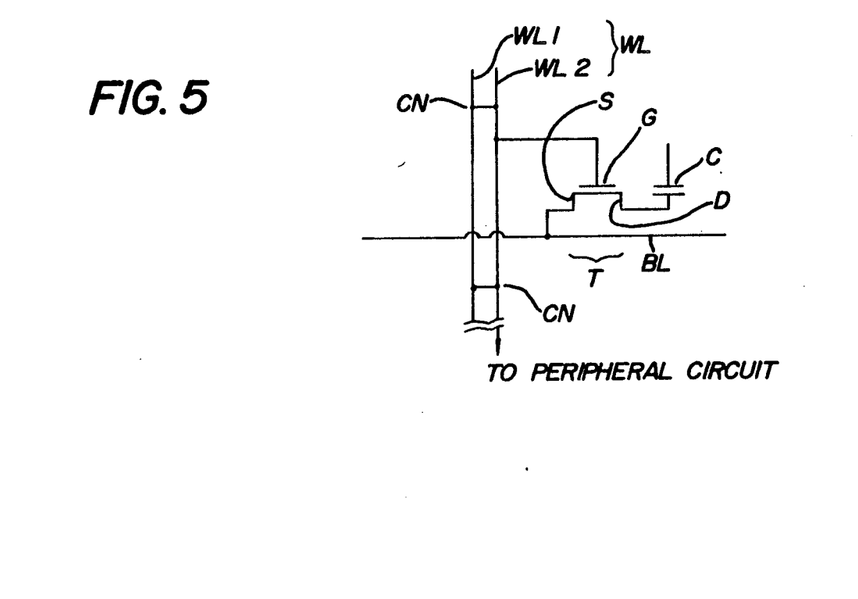
FIG. 5 is a circuit diagram of a DRAM (dynamic random access memory) to which the present invention is applicable.

In reference to a circuit diagram of a memory cell of DRAM in FIG. 5; a cross-sectional view cut along a bit line of the DRAM in FIG. 6; and a cross-sectional view cut along a word line of the of the DRAM in FIG. 7, a preferred embodiment of the present invention for multi-layer wirings of DRAM (dynamic random access memory) is hereinafter described in detail. Each cell comprises a transistor T and a capacitor C as shown in FIG. 5. A single word line WL is composed such that a first word line WL-1 (21 in FIG. 6) and a second word line WL-2 (22 in FIG. 6) are positioned in parallel to each other, and are connected to each other at connection points CN which are located in approximately 100 μm pitch. The second words line 22 acts as a gate electrode of the transistor T. A source electrode S is connected to a bit line BL. A drain electrode D is connected to the capacitor C. The capacitor is composed of a first electrode 33, a second electrode 35 and an $SiO_2$ layer 34 therebetween, as shown in FIG. 6.

Figure 8A:
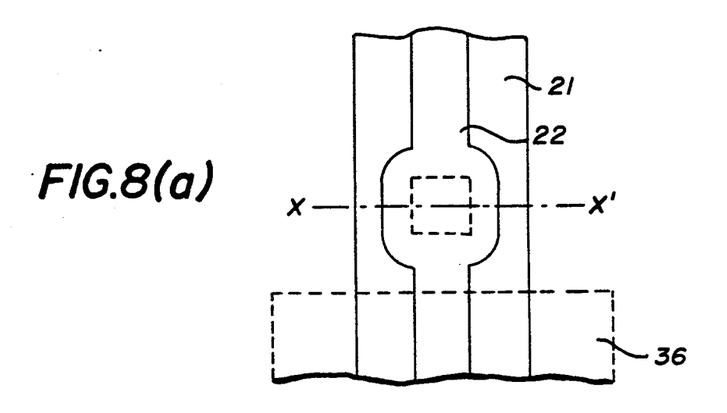
FIG. 8(a) is a cross-sectional view of the first and second word lines employed of the DRAM of FIGS. 5 through 7.
Figure 8B:
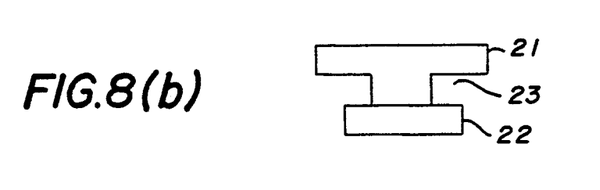
FIG. 8(b) is a plan view of the first and second word lines of FIG. 8(a).
Figure 9:
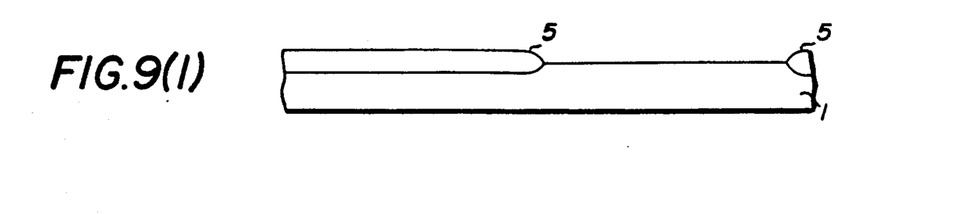

Structure of the first and the second word lines are illustrated in FIGS. 8(a) and 8(b). FIG. 8(b) is a cross-sectional view cut along X—X' of FIG. 8(a). The first word line 21 (WL-1) is typically formed of $TiSi_2$ having, for example, 2 μm width, and 2000 Å thick. The second word line 22 (WL-2) is located beneath the first word line via an $SiO_2$ layer 23 and is formed of typically tungsten polycide, which is, as described above, a combination of a 2000 Å thick polycrystalline silicon layer and a 2000 Å thick $WSi_x$ layer, each having typically 0.8 μm width. The first and second word lines are connected with each other through contact holes of the $SiO_2$ film 23, having typically 0.8 μm diameter, located at approximately 100 μm pitch along the lines. As illustrated in FIG. 8(b), at the interconnection, having typically 1 μm diameter, between the first and second word lines, the width of the first word line 21 is increased typically by 0.5 μm. The numeral 36 denotes the location of a memory cell. The polycrystalline silicon layer of the second word line 22 is more suitable than $WSi_x$ to form a gate electrode of the transistor T. The narrow gate electrode is advantageous to enhance the integration density of the memory cells. The wide first word line, composed of electrically better conductive material $TiSi_x$ than $WSi_x$ or polycrystalline Si, contributes to reduce the resistivity of the word line, resulting in an improved speed of the memory access operation.

Figure 6:
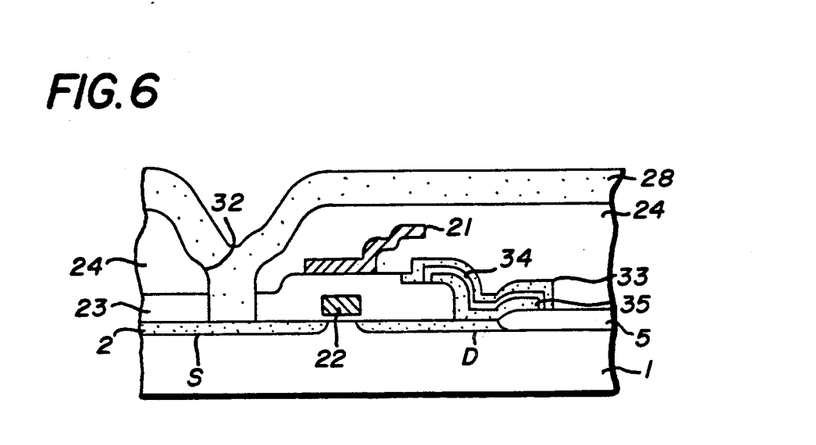
FIG. 6 is a cross-sectional view cut along a bit line of the structure of a DRAM according to the present invention.
Figure 7:
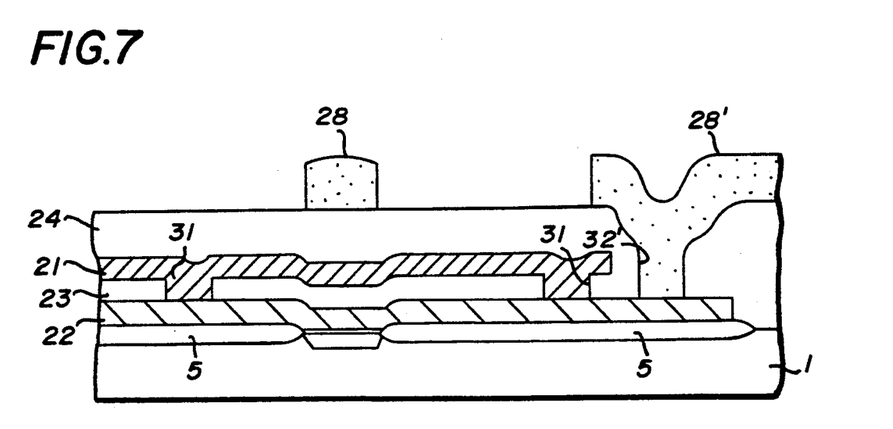
FIG. 7 is a cross-sectional view cut along a word line of a structure of the DRAM of FIG. 6.

At a peripheral area of arrays of the memory cells, the second word lines 22 extend farther from the first word line 21 as shown in FIG. 7. A layer-wiring 28' formed of Al which contains, for example, 1% of Si, is deposited and patterned upon the $SiO_2$ film 24 so that peripheral circuits, such as memory driver, etc., are connected to the extending part of the second word line 22 through a contact hole 32' of the $SiO_2$ films 23 and 24. Bit line 28 also formed of Al containing, for example, approximately 1% of Si, is patterned upon the $SiO_2$ film 24 so as to connect the source region S, as shown in FIG. 6.

Owing to the structure of FIGS. 5 through 7 and the process of FIGS. 4 of the present invention, that is, the bridge by the second word line 22 which is resistant to a HF containing solution, both the contacts of the top layer-wiring 28' to the word lines (21 and 22), and the top layer-wiring 28 to the source region S (FIG. 6) satisfactorily accomplish good electrical contacts therebetween.

If the top wiring 28' is attempted to contact the first word line without employing the present invention, at least three steps, i.e., a step for opening a contact hole, a step for cleaning the exposed material with a HF solution and a step for Al patterning, are required in addition to the above-described steps of the invention as described in the chapter of Description of the Related Art.

Though in the principle structure FIG. 2(a) of the present invention, only $TiSi_x$ was referred to as the material A which is not resistant to HF solution, there may also be employed Al; Al-Si alloy; zirconium silicide ($ZrSi_x$, where x is 1.8 to 3.0, typically 2.0); tantalum silicide ($TaSi_x$, where x is 1.8 to 3.0, typically 2.0); or titanium silicide ($TiSi_x$, where x is 1.8 to 3.0, typically 2.0). Furthermore, only $WSi_x$, where x is 1.8 to 3.0, typically 2.0) was referred to as the material B which is resistant to HF solution, there may also be employed molybdenum silicide ($MoSi_x$, where x is 1.8 to 3.0, typically 2.0); molybdenum (Mo); tungsten (W); titanium nitride (TiN); polycrystalline silicon or their combination. Still furthermore, only Al which contains 1% Si was referred to as the material C for the top wiring, there may also be employed any material regardless to the effect of the HF solution, such as Al; Al-Si alloy; $ZrSi_x$; $TaSi_x$; $TiSi_x$; $WSi_x$; $MoSi_x$; Mo; W; TiN or polycrystalline silicon.

Figure 2B:
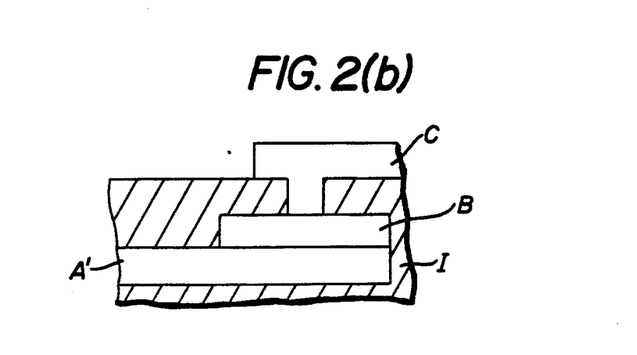

Referring to FIG. 2(b), a second preferred embodiment of the present invention is hereinafter schematically described. In FIG. 2(b), the notations A, B and C denote the same materials as those referred to in above description. A buried layer-wiring formed of material A, such as $TiSi_2$ having quite a small electrical resistivity but soluble by a HF containing solution, is partially or entirely coated with a buffer layer formed of material B, such as titan nitride (TiN), which is resistant to the HF containing solution. The buried layer A having the buffer layer B thereon is covered, i.e. protected, with an insulation layer formed of, such as $SiO_2$. A top layer formed of material C contacts the buffer layer through a contact hole of the $SiO_2$ layer I. When the contact hole is opened through the $SiO_2$ layer I and then a native oxide produced thereon is removed with a HF containing solution, the buried layer A is not exposed to, i.e. is protected from, the HF containing solution. Accordingly, good and reliable contact between the buried layer A and the top layer C is accomplished. The top layer C may be further connected to a doped Si region, in a similar way to that of FIGS. 6 and 7.

Referring to FIGS. 9, sequential steps of the fabrication process of the structure of FIG. 2(b) are hereinafter described in detail.

In step 1, shown in FIG. 9(1), LOCOS 5 is formed in a similar way to that of step 1 of the fabrication process (FIGS. 4) of the first preferred embodiment.

In step 2, shown in FIG. 9(2), an impurity is implanted to the Si substrate 1 and heated in a similar way to that of FIG. 4(2) so as to form a doped Si region 2.

In step 3, shown in FIG. 9(3), an $SiO_2$ film 3 is deposited thereon in a similar way to that of FIG. 4(3).

In step 4, shown in FIG. 9(4), an Al layer 15 which contains approximately 1% Si is deposited as thick as approximately 0.5 μm on the Si film 3 according to a conventional method, such as sputtering. Next, a titan nitride (TiN) film 16 is deposited and then patterned on the Al layer 15 as thick as approximately 1000 Å, according to a conventional method, such as CVD and photo-lithography technique. Next, the Al layer 15 is patterned according to a conventional method, such as reactive ion etching.

In step 5, shown in FIG. 9(5), an $SiO_2$ film 14' is deposited as thick as approximately 5000 Å on the patterned Al layer 15 and TiN layer 16 as well as on the $SiO_2$ film 3, in a similar way to that of FIG. 4(5). Next, contact holes 8' and 9' is opened through the $SiO_2$ film 14' so as to expose a part of the doped Si region 2 and a part of the TiN buffer film 16, in a similar way to that of FIG. 4(5).

In step 6, shown in FIG. 9(6), after native oxides of the exposed parts, the diffused Si and the TiN, in the contact holes 8' and 9', are removed by a HF containing solution, an Al pattern-wiring 7 is formed on the $SiO_2$ film 14' as well as in the contact holes 8' and 9'.

Figure 10:
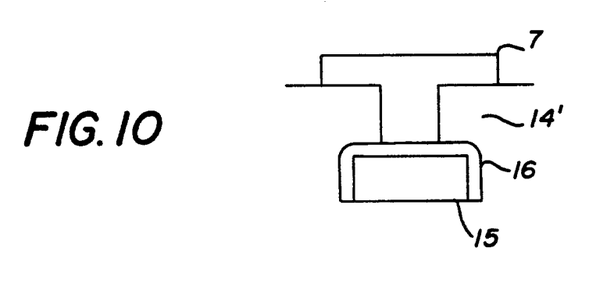
FIG. 10 is a cross-sectional view of a variation of the structure of FIG. 2(b).

In the above-described second preferred embodiment of the present invention, the TiN film 16 acts as a buffer, i.e. protective, layer for the Al layer 15, which is soluble in HF solution. Accordingly, a material, such as Al, etc., which is a preferable material for the layer-wiring because of its high electrical conductivity but soluble by HF solution, can be employed as a wiring buried in the $SiO_2$ films. The patterned TiN film 16 may be formed either locally on the contacted hole area only, or entirely upon, or entirely upon and on sides of, the patterned Al layer 15, as shown in FIG. 10.

Though in the description of the above-described preferred embodiments of the present invention, the top layer 7, and the $WSi_x$ layer 22 are insulated with $SiO_2$ layer 14, 14' or 5, the top layer 7 or the $WSi_x$ layer 22 may be insulated with an air gap, as long as the layer 21 or 15 is protected with an $SiO_2$ layer from a HF solution during the cleaning process.

Though in the above-described preferred embodiments of the present invention, the insulting layers 3, 14, 14', 15, 7 and 4 are referred to as $SiO_2$, all or some of them may be formed of other insulating materials, such as phospho-silicate glass (PSG), polyimide, SOG (spin on glass), silicon nitride ($Si_3N_4$); borophospho silicate glass (BPSG); silicon nitride ($Si_3N_4$) and a local air gap, may be employed.

The many features and advantages of the invention are apparent from the detailed specification and thus, it is intended by the appended claims to cover all such features and advantages of the system which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

What I claim is:

1. A semiconductor device comprising:
   a first wiring formed of an electrically conductive material which is soluble in a solution containing hydrofluoric acid, said first wiring being insulatingly arranged upon a semiconductor substrate;
   a first insulating layer formed on said first wiring;
   a second wiring formed of an electrically conductive material, arranged insulatingly from said first wiring, said second wiring overlies said first wiring via said first insulating layer;
   a second insulating layer formed under said first wiring; and
   a third wiring, formed of an electrically conductive material being resistant to a solution containing hydrofluoric acid, said third wiring electrically connecting said first wiring and said second wiring, a first part of said third wiring underlies said first wiring via said second insulating layer and is connected to said first wiring through a plurality of first contact holes provided through said second insulating layer at a predetermined spacing therebetween along said first wiring, a second part of said third wiring, which extends from said first part, is connected to said second wiring through a second contact hole provided through said first and second insulating layers.

2. A semiconductor device according to claim 1, wherein the material of said first wiring is selected from a group of titanium silicide ($TiSi_x$ where x is from 1.8 to 3.0); aluminum (Al); aluminum alloy; zirconium silicide ($ZrSi_x$ where x is from 1.8 to 3.0); and tantalum silicide ($TaSi_x$ where x is from 1.8 to 3.0).

3. A semiconductor device according to claim 1, wherein the material of said second wiring is selected form a group of aluminum (Al), aluminum alloy; titanium silicide ($TiSi_x$ where x is from 1.8 to 3.0), zirconium silicide ($ZrSi_x$ where x is from 1.8 to 3.0), and tantalum silicide ($TaSi_x$ where x is from 1.8 to 3.0), tungsten silicide ($WSi_x$ where x is from 1.8 to 3.0); molybdenum silicide ($MoSi_x$ where x is from 1.8 to 3.0); tungsten (W); molybdenum (Mo); titanium nitride (TiN); and silicon.

4. A semiconductor device according to claim 1, wherein the material of said third wiring is selected from a group of tungsten silicide ($WSi_x$ where x is from 1.8 to 3.0); molybdenum silicide ($MoSi_x$ where x is from 1.8 to 3.0); tungsten (W); molybdenum (Mo); titanium nitride (TiN); and silicon.

5. A semiconductor device according to claim 1, wherein each of the materials of said first and second insulating layers is chosen from a group of silicon dioxide ($SiO_2$); phospho-silicate glass (PSG); polyimide; spin-on-glass (SOG); silicon nitride ($Si_3N_4$); borophospho silicate glass (BPSG); and a local air gap.

6. A semiconductor device according to claim 1, wherein said second wiring further contacts a part of said semiconductor substrate through a third hole provided through said first and second insulating layers.

7. A semiconductor device according to claim 1, wherein said third wiring forms a gate electrode of a transistor.

* * * * *